United States Patent [19]
Hashimoto et al.

[11] Patent Number: 5,475,257
[45] Date of Patent: Dec. 12, 1995

[54] SEMICONDUCTOR DEVICE HAVING AN IMPROVED LOW RESISTIVE CONTACT

[75] Inventors: Takasuke Hashimoto; Tsutomu Tashiro, both of Tokyo, Japan

[73] Assignee: NEC Corporation, Tokyo, Japan

[21] Appl. No.: 329,992

[22] Filed: Oct. 27, 1994

Related U.S. Application Data

[63] Continuation of Ser. No. 21,747, Feb. 19, 1993, abandoned.

[30] Foreign Application Priority Data

Feb. 19, 1992 [JP] Japan ..................................... 4-031223

[51] Int. Cl.⁶ ............................. H01L 23/48; H01L 29/40
[52] U.S. Cl. ........................ 257/587; 257/588; 257/754; 257/773; 257/646
[58] Field of Search .................................... 257/587, 588, 257/754, 770, 774, 508, 530, 514, 515, 517, 518, 519, 520, 621, 905, 646, 54, 60, 52, 773

[56] References Cited

U.S. PATENT DOCUMENTS

| | | | |
|---|---|---|---|
| 4,067,100 | 1/1978 | Kojima et al. | 29/578 |
| 4,717,681 | 1/1988 | Curran | 257/197 |
| 4,803,528 | 2/1989 | Pankove | 257/410 |
| 4,862,227 | 8/1989 | Tsuge et al. | 257/905 |
| 5,003,365 | 3/1991 | Havemann et al. | 257/514 |
| 5,093,711 | 3/1992 | Hirakawa | 257/52 |
| 5,202,579 | 4/1993 | Fujii et al. | 257/751 |
| 5,250,837 | 10/1993 | Sparks | 257/565 |

FOREIGN PATENT DOCUMENTS

| | | | |
|---|---|---|---|
| 59-195823 | 11/1984 | Japan | 257/770 |
| 2-148760 | 6/1990 | Japan | 257/508 |
| 2-211668 | 8/1990 | Japan | 257/517 |

OTHER PUBLICATIONS

"Spotec–A Sub–10–μm² Bipolar Transistor Structure Using Fully Self-Aligned Sidewall Polycide Base Technology", *IEDM*, 1991, by T. Shiba et al., pp. 16.4.1–16.4.4.

*Primary Examiner*—Jerome Jackson
*Assistant Examiner*—John Guay
*Attorney, Agent, or Firm*—Young & Thompson

[57] ABSTRACT

The invention is a semiconductor device having a metal-semiconductor contact structure. The device includes a metal region having such a high conductivity as to serve as a contact plug. The device also includes a first semiconductor region having a first band gap and being so doped with one conductive type dopant as to exhibit a high conductivity. The device also includes a semiconductor film having a second band gap wider than the first band gap. The semiconductor film is in contact at its opposite surfaces with a part of the metal region and a part of the first semiconductor region respectively. The semiconductor film is doped with the one conductive type dopant so heavily as to suppress electrical current flow between the part of the metal region and the part of the first semiconductor region through the semiconductor film. The semiconductor film comprises amorphous silicon or poly-crystalline silicon. Alternatively, the second semiconductor film comprises non-doped amorphous silicon or non-doped poly-crystalline silicon.

2 Claims, 4 Drawing Sheets

SEMICONDUCTOR DEVICE HAVING AN IMPROVED LOW RESISTIVE CONTACT

This application is a continuation of application Ser. No. 08/021,747, filed Feb. 19, 1993, now abandoned.

BACKGROUND OF THE INVENTION

The invention relates to a semiconductor device having a low resistive contact, and more particularly to a bipolar transistor having a low resistive collector plug.

A high speed silicon bipolar transistor with a small size is attractive. The realization of a high speed performance of the silicon bipolar transistor depends upon many factors, one of which is its collector series resistance. The reduction of the collector series resistance of the bipolar transistor makes it possible to accomplish the high speed performance thereof.

The conventional silicon bipolar transistor having a reduced collector resistance will be described with reference to FIG. 1. In FIG. 1, the conventional silicon bipolar transistor has a p-type silicon substrate 1. An $n^+$-type low resistive buried layer 2 is formed on the silicon substrate 1. The $n^+$-type low resistive buried layer 2 is so doped with an n-type dopant that the resistivity of the low resistive buried layer 2 is reduced. An n-type silicon epitaxial layer 3 is formed on the $n^+$-type low resistive buried layer 2. The n-type silicon epitaxial layer 3 is doped with an n-type dopant up to a lower dopant concentration of approximately $10^{16}$ cm$^{-3}$ than a dopant concentration of the $n^+$-type low resistive buried layer 2. Trench grooves are formed in the n-type silicon epitaxial layer 3 and the $n^+$-type low resistive buried layer 2 so that a bottom of each of the trench grooves reaches the p-type silicon substrate 1 through the above two layers 2 and 3. The trench grooves are filled with a dielectric or an insulation material so that trench isolation regions 12 are formed in the n-type silicon epitaxial layer 3 and the $n^+$-type low resistive buried layer 2. The trench isolation regions serve to electrically separate a bipolar transistor from other elements.

Further, an insulation film 8 is formed on the n-type silicon epitaxial layer 3. Portions of the insulation film 8 are so removed by etching that openings are formed in the insulation film 8. An ion-implantation of a p-type dopant into the n-type silicon epitaxial layer 3 is accomplished through one of the openings formed in the insulator film 8 followed by a diffusion of the p-type dopant so that a p-type base region 6 is formed at an upper portion of the n-type silicon epitaxial layer 3. Subsequently, an ion-implantation of an n-type dopant into the p-type base region 6 is accomplished through another of the openings formed in the insulator film 8 followed by a diffusion of the n-type dopant so that an n-type emitter region 7 is formed at an upper portion of the p-type base region 6.

In addition, an ion-implantation of the n-type dopant into the n-type silicon epitaxial layer 3 is accomplished through another of the openings formed in the insulator film 8 followed by a diffusion of the n-type dopant so that an n-type low resistive diffusion region 16. The n-type low resistive diffusion region 16 is so formed that its bottom reaches at least on the $n^+$-type low resistive buried layer 2. The n-type low resistive diffusion region 16 also serves as a collector plug of the bipolar transistor. Since the n-type low resistive diffusion region 16 has a high dopant concentration and a low resistivity, the collector series resistance is reduced. Namely, the existence of the n-type low resistive diffusion region 16 makes the collector series resistance reduced. The reduction of the collector series resistance provided by the n-type low resistive diffusion region 16 permits the bipolar transistor to exhibit a high speed performance. Phosphorus is available as the above n-type dopant, although other dopants such as arsenic are also available.

Subsequently, an evaporation of aluminium or an aluminium based metal suitable as a contact material is so implemented that the contact material layer not only covers the surface of the device, but also contacts with the p-type base region 6, the n-type emitter region 7 and the n-type low resistive diffusion region 16 respectively. After that, the contact material layer is so etched that portions of the contact material layer remain but only in the vicinity of the above opening portions. Namely, portions of the contact material layer remain at the openings of the insulation film 8 over the p-type base region 6, the n-type emitter region 7 and the n-type low resistive diffusion region 16 respectively so that the respective remaining portions of the contact material layer serve as a base contact 11, an emitter contact 10 and a collector contact 9.

The conventional bipolar transistor having the n-type low resistive diffusion region 16, however, has disadvantages in a high integration for integrated circuits, which will be described.

As described above, the formation of the n-type low resistive diffusion region 16 requires a diffusion process. Thus, in the diffusion process, the n-type dopant is diffused not only in the vertical direction relative to the surface of the p-type silicon substrate 1 but also in the lateral direction and thus the parallel direction relative to the surface of the p-type silicon substrate 1. The diffusion of the n-type dopant in the lateral direction provides a possibility of a contact of the n-type low resistive diffusion region 16 with the p-type base region 6. Even if this does not happen, the diffusion of the n-type dopant in the lateral direction makes the n-type low resistive diffusion region 16 approach the p-type base region 6. Accordingly, it is necessary to separate the n-type low resistive diffusion region 16 from the p-type base region 6 in order to keep them from being in contact with one another. Alternatively, it is necessary to isolate by an insulation film the n-type low resistive diffusion region 16 from the p-type base region 6. This makes it difficult to improve the miniaturization of the bipolar transistor. This further makes it difficult to achieve a high density integration of integrated circuits.

Another conventional silicon bipolar transistor having a reduced collector resistance will be described with reference to FIG. 2. The structure of this other silicon bipolar transistor is analogous to the structure of the above mentioned silicon bipolar transistor as illustrated in FIG. 1, except for the n-type low resistive diffusion region 16. In FIG. 2, this other conventional silicon bipolar transistor has a p-type silicon substrate 1. An $n^+$-type low resistive buried layer 2 is formed on the silicon substrate 1. The $n^+$-type low resistive buried layer 2 is so doped with an n-type dopant that the resistivity of the buried layer 2 is reduced. An n-type silicon epitaxial layer 3 is formed on the $n^+$-type low resistive buried layer 2. The n-type silicon epitaxial layer 3 is doped with an n-type dopant up to a lower dopant concentration of approximately $10^{16}$ cm$^{-3}$ than a dopant concentration of the $n^+$-type low resistive buried layer 2. Trench grooves are formed in the n-type silicon epitaxial layer 3 and the $n^+$-type low resistive buried layer 2 so that a bottom of each of the trench grooves reaches the p-type silicon substrate 1 through the above two layers 2 and 3. The trench grooves are filled with a dielectric or an insulation material so that trench isolation regions 12 are formed in the n-type silicon epitaxial layer 3 and the n+-type low resistive buried layer 2. The trench isolation regions serve to electrically separate a bipolar transistor from other elements.

Further, an insulation film 8 is formed on the n-type silicon epitaxial layer 3. Portions of the insulation film 8 are removed by etching so that openings are formed in the insulation film 8. An ion-implantation of a p-type dopant into the n-type silicon epitaxial layer 3 is accomplished through one of the openings formed in the insulator film 8 followed by a diffusion of the p-type dopant so that a p-type base region 6 is formed at an upper portion of the n-type silicon epitaxial layer 3. Subsequently, an ion-implantation of an n-type dopant into the p-type base region 6 is accomplished through another of the openings formed in the insulator film 8 followed by a diffusion of the n-type dopant so that an n-type emitter region 7 is formed at an upper portion of the p-type base region 6.

In addition, a trench groove is formed in the n-type silicon epitaxial layer 3 and the n+-type low resistive buried layer 2 so that a bottom of the trench groove does not reach the p-type silicon substrate 1 and thus exists within the n+-type low resistive buried layer 2. The trench groove is filled with a metal such as tungsten so that a buried metal region 4 is formed in the n-type silicon epitaxial layer 3 and the n+-type low resistive buried layer 2. The buried metal region 4 serves as a collector plug of the bipolar transistor. Since the buried metal region 4 has a lower resistivity than the resistivity of the above n-type low resistive diffusion region 16 as illustrated in FIG. 1, the collector series resistance is much more reduced. Namely, the existence of the buried metal region 4 makes the collector series resistance reduced. The reduction of the collector series resistance provided by the buried metal region 4 permits the bipolar transistor to exhibit high speed performance.

Subsequently, vapor deposition of aluminium or an aluminium based metal suitable as a contact material is so implemented that the contact material layer covers the surface of the device, but contacts the p-type base region 6, the n-type emitter region 7 and the buried metal region 4 respectively. After that, the contact material layer is so etched that portions of the contact material layer remain only in the vicinity of the above opening portions. Namely, portions of the contact material layer remain at the openings in the insulation film 8 over the p-type base region 6, the n-type emitter region 7 and the buried metal region 4 respectively so that the respective remaining portions of the contact material layer serve as a base contact 11, an emitter contact 10 and a collector contact 9.

The conventional bipolar transistor having the buried metal region 4, however, has disadvantages in high density integration for integrated circuits, which will be described.

An interface between the buried metal region 4 and the n-type silicon eqitaxial layer 3 or the n+-type low resistive buried layer 2 exhibits a Schottky junction as a metal-semiconductor junction. The Schottky junction forms a Schottky barrier. Since the n-type silicon epitaxial layer 3 has the dopant concentration of approximately $10^{16}$ cm$^{-3}$ as described above, electrons are able to move from the n-type silicon epitaxial layer 3 to the buried metal region 4 through the Schottky junction, or carriers are able to move from the buried metal region 4 to the n-type silicon epitaxial layer 3. This causes an electrical current of carriers to flow from the buried metal region 4 to the n-type silicon epitaxial layer 3 in the lateral direction. Namely, a current flow occurs. Accordingly, this other bipolar transistor having the buried metal region 4 is required to keep the electrical current of carriers in the lateral direction from reaching the p-type base region 6. Thus, it is necessary to prevent a short circuit current from the buried metal region 4 to the p-type base region through the n-type silicon epitaxial layer 3. This requires the buried metal region 4 to be a predetermined distance from the n-type silicon epitaxial layer 3. This makes it difficult to achieve the minimization of the device size, and further keeps a high density integration of integrated circuits from being achieved.

Accordingly, the development of a novel bipolar transistor having a lower collector series resistance is desired to achieve not only high speed performance of the bipolar transistor provided by making the collector series resistance reduced but also an improvement in the miniaturization of the device size and thus an improvement in the high integration of the circuits. Further, the development of a novel metal and semiconductor contact structure breaking a Schottky barrier to prevent carriers from moving across an interface of metal and semiconductor regions is needed.

OBJECTS OF THE INVENTION

Accordingly, a primary object of the present invention to provide a novel bipolar transistor having an improved low resistive collector series resistance.

It is a further object of the present invention to provide a novel bipolar transistor having an improved low resistive collector series resistance, which exhibits a high speed performance.

It is a still further object of the present invention to provide a novel bipolar transistor having an improved low resistive collector series resistance and having a small size, which permits a high density integration.

It is another object of the present invention to provide a novel semiconductor device having an improved metal-semiconductor contact structure.

It is still another object of the present invention to provide a semiconductor device having an improved metal-semiconductor contact structure breaking a Schottky barrier so as to suppress carriers from moving across an interface of a metal region and a semiconductor region.

It is yet another object of the present invention to provide a novel semiconductor device having an improved metal-semiconductor contact structure which permits the semiconductor device to exhibit high speed performance.

It is an additional object of the present invention to provide a novel semiconductor device having an improved metal-semiconductor contact structure which improves miniaturization of the semiconductor device for achieving high density integration.

The above and other objects, features and advantages of the present invention will be apparent from the following descriptions.

SUMMARY OF THE INVENTION

The present invention is a semiconductor device having an improved metal-semiconductor contact structure. The semiconductor device has a p-type silicon substrate. An n+-type buried silicon layer is formed on the p-type silicon substrate. An n-type epitaxial silicon layer is formed on the n+-type buried silicon layer. A p-type base region is formed in an upper portion of the n-type epitaxial silicon layer. An n-type emitter region is formed in an upper portion of the p-type base region. A metal region serving as a collector contact plug is formed in the n-type epitaxial silicon layer and the n⁺-type buried silicon layer. A bottom of the metal region exists within the n⁺-type buried silicon layer. Further, the metal region is covered at its side surface with a non-doped amorphous silicon film. Alternatively, the metal region is covered at its side surface with a doped amorphous islicon film having a dopant concentration of $5\times10^{18}$ atoms/cm³. Alternatively, the metal region is covered at its side surface with a doped poly-crystalline silicon film having a dopant concentration of $5\times10^{18}$ atoms/cm³. Alternatively, the metal region is covered at its side surface with a non-doped poly-crystalline silicon film. The metal region comprises a metal multi-layer of tungsten/titanium nitride/titanium. The metal region also comprises a metal including molybdenum. The metal region also comprises a metal including copper.

The present invention has a novel metal-semiconductor contact structure in a semiconductor device. The novel contact structure includes a metal region having such a high conductivity as to serve as a contact plug. The novel contact structure also includes a first semiconductor region having a first band gap and being so doped with one conductive type dopant as to exhibit high conductivity. The novel contact structure also includes a second semiconductor film having a second band gap wider than the first band gap. The second semiconductor film is in contact at its opposite surfaces with a part of the metal region and a part of the first semiconductor region respectively. The second semiconductor film is further doped with the one conductive type dopant so heavily as to suppress an electric current of carriers from flowing between the part of the metal region and the part of the first semiconductor region through the second semiconductor film. The first semiconductor region comprises mono-crystalline silicon. The second semiconductor film comprises amorphous silicon or poly-crystalline silicon. The second semiconductor film is so doped with an n-type dopant as to have a dopant concentration of approximately $5\times10^{18}$ atoms/cm³ or higher. The metal region comprises a multi-layer structure of tungsten/titanium nitride/titanium, a metal including molybdenum or a metal including copper.

In the metal-semiconductor contact structure, the second semiconductor region may comprise non-doped amorphous silicon or non-doped poly-crystalline silicon.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

The present invention is a novel semiconductor device having an improved metal-semiconductor contact structure without a Schortky barrier, which suppresses carriers from moving across an interface of a metal and semiconductor contact.

The present invention is also a novel bipolar transistor including an improved collector plug structure providing a low collector series resistance and concurrently suppressing carriers from moving across an interface of a metal semiconductor contact provided by the collector plug.

A first embodiment of the present invention will be described in detail with reference to FIGS. 3 and 4A to 4C. The first embodiment of the present invention is a novel bipolar transistor, although it is applicable to other semiconductor devices. A novel bipolar transistor of the first embodiment includes an improved metal semiconductor contact structure in which a metal region serves as a collector plug.

Figure 1:
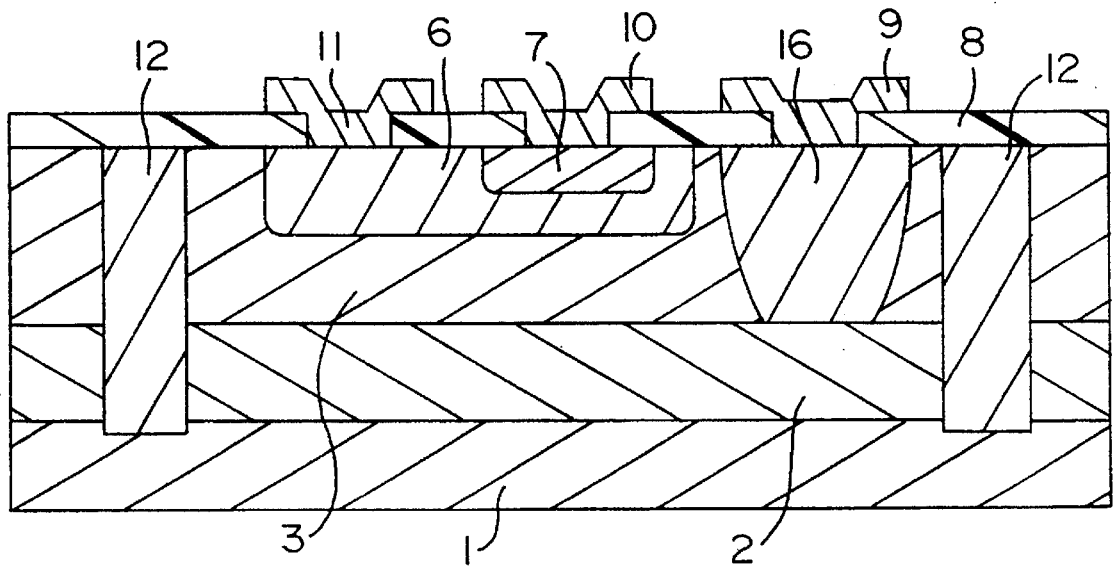
FIG. 1 is a fragmentary cross sectional elevation view illustrative of the structure of the conventional bipolar transistor exhibiting a low collector series resistance.
Figure 2:
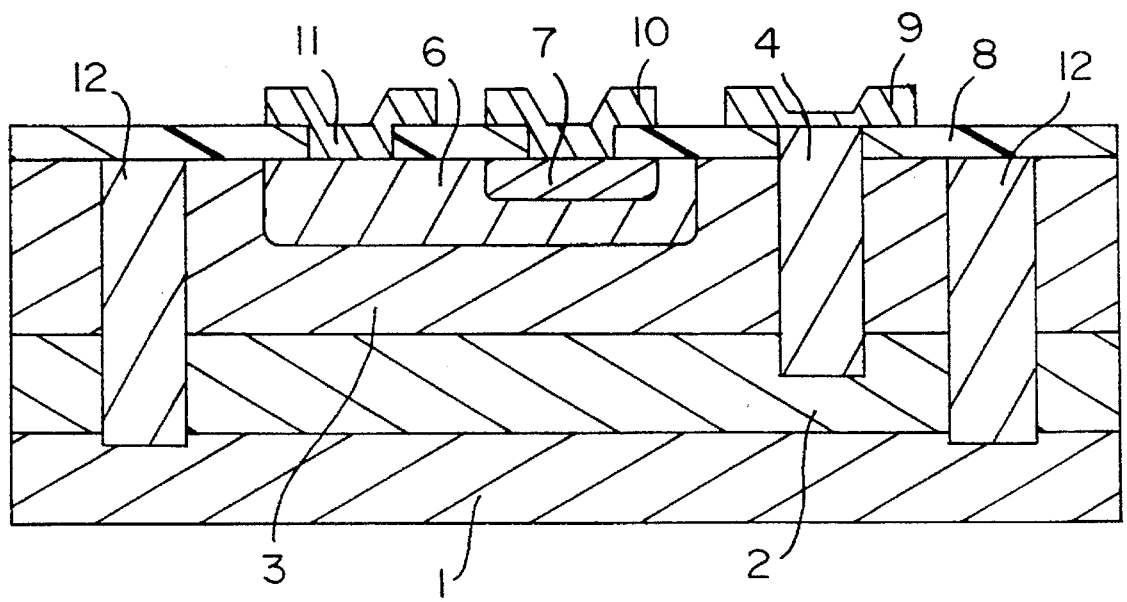
FIG. 2 is a fragmentary cross sectional elevation view illustrative of the structure of another conventional bipolar transistor exhibiting a low collector series resistance.
Figure 3:
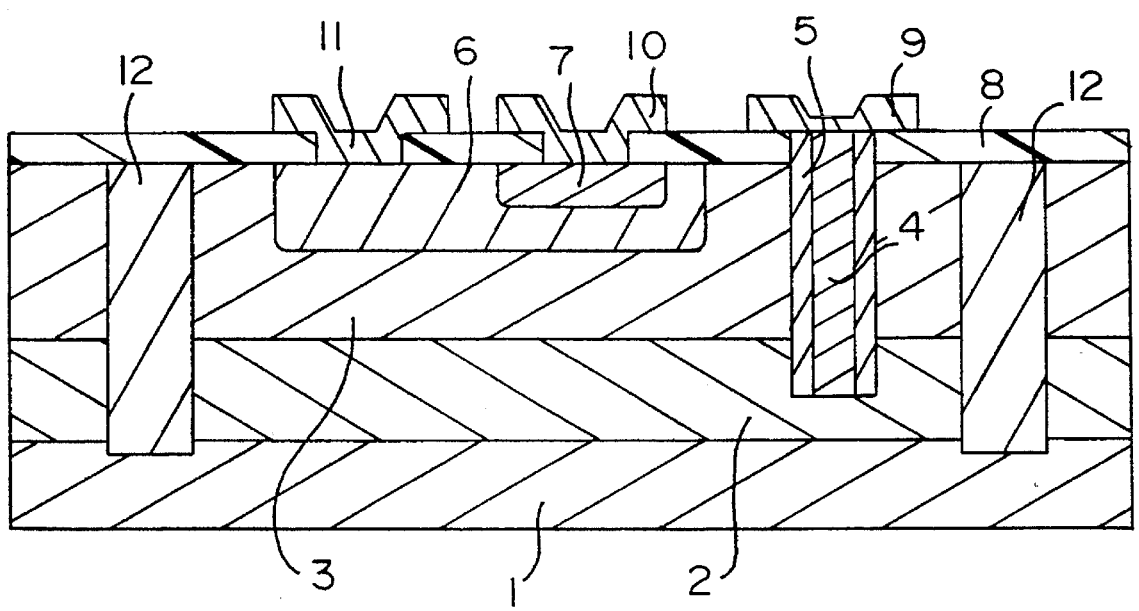
FIG. 3 is a fragmentary cross sectional elevation view illustrative of a structure of a novel bipolar transistor exhibiting a low collector series resistance of a first embodiment according to the present invention.

A structure of a novel bipolar transistor provided by the first embodiment according to the present invention will be described with reference to FIG. 3. The novel silicon bipolar transistor has a p-type silicon substrate 1. An n⁺-type low resistive buried layer 2 overlies the silicon substrate 1. An n-type silicon epitaxial layer 3 overlies the n⁺-type low resistive buried layer 2. Trench isolation regions 12 exist in the n-type silicon epitaxial layer 3 and the n⁺-type low resistive buried layer 2. A bottom of each of the trench isolation regions 12 reaches the p-type silicon substrate 1 so as to electrically separate the bipolar transistor from other elements.

Further, an insulation film 8 covers the n-type silicon epitaxial layer 3 in which openings are formed in the insulation film 8. A p-type base region 6 exists at an upper portion of the n-type silicon epitaxial layer 3. An n-type emitter region 7 exists at an upper portion of the p-type base region 6. A base contact 11 exists on the p-type base region 6. An emitter contact 10 exists on the n-type emitter region 7. A collector contact 9 exists on a collector portion.

In addition, a buried metal region 4 made of a metal multi-layer of tungsten/titanium nitride/titanium exists directly under the collector contact 9 so as to be in contact with the collector contact 9. A surface of the side of the buried metal region 4 is covered with a non-doped amorphous silicon film 5. Thus, the buried metal region 4 except for its top and bottom surfaces is covered by the non-doped amorphous silicon film 5. The non-doped amorphous silicon film 5 at its opposite surface contacts the n-type silicon epitaxial layer 3 and the n⁺-type low resistive buried layer 2. Although in this first embodiment the non-doped amorphous silicon film 5 covers the entire surface of the sides of the buried metal region 4, it is necessary that the non-doped amorphous silicon film 5 covers the buried metal layer 4 at least at its area of side surface which contacts the n-type silicon epitaxial layer 3.

A fabrication method of the novel silicon bipolar transistor of the first embodiment according to the present invention will be described with reference to FIGS. 4A to 4C. A p-type silicon substrate 1 is prepared. An n⁺-type low resistive buried layer 2 is formed on the silicon substrate 1. The n⁺-type low resistive buried layer 2 is so doped with an n-type dopant that the resistivity of the buried layer 2 is reduced. An n-type silicon epitaxial layer 3 is formed on the n⁺-type low resistive buried layer 2. The n-type silicon epitaxial layer 3 is doped with an n-type dopant at a lower dopant concentration of approximately $10^{16}$ cm$^{-3}$ than a dopant concentration of the n⁺-type low resistive buried layer 2. Trench grooves are formed by anisotropic etching in the n-type silicon epitaxial layer 3 and the n⁺-type low resistive buried layer 2 so that a bottom of each of the trench grooves reaches the p-type silicon substrate 1 through the above two layers 2 and 3. The trench grooves are filled with a dielectric or an insulation material so that trench isolation regions 12 are formed in the n-type silicon epitaxial layer 3 and the n⁺-type low resistive buried layer 2. The trench isolation regions serve to electrically separate a bipolar transistor from other elements.

Further, an insulation film 3 is formed on the n-type silicon epitaxial layer 3. A portion of the insulation film 8 is removed by etching so that openings are formed in the insulation film 8. An ion-implantation of a p-type dopant into the n-type silicon epitaxial layer 3 is accomplished through one of the openings formed in the insulation film 8 followed by a diffusion of the p-type dopant so that a p-type base region 6 is formed at an upper portion of the n-type silicon epitaxial layer 3. Subsequently, ion-implantation of an n-type dopant into the p-type base region 6 is accomplished through another of the openings formed in the insulator film 8 followed by a diffusion of the n-type dopant so that an n-type emitter region 7 is formed at an upper portion of the p-type base region 6.

Figure 4A:
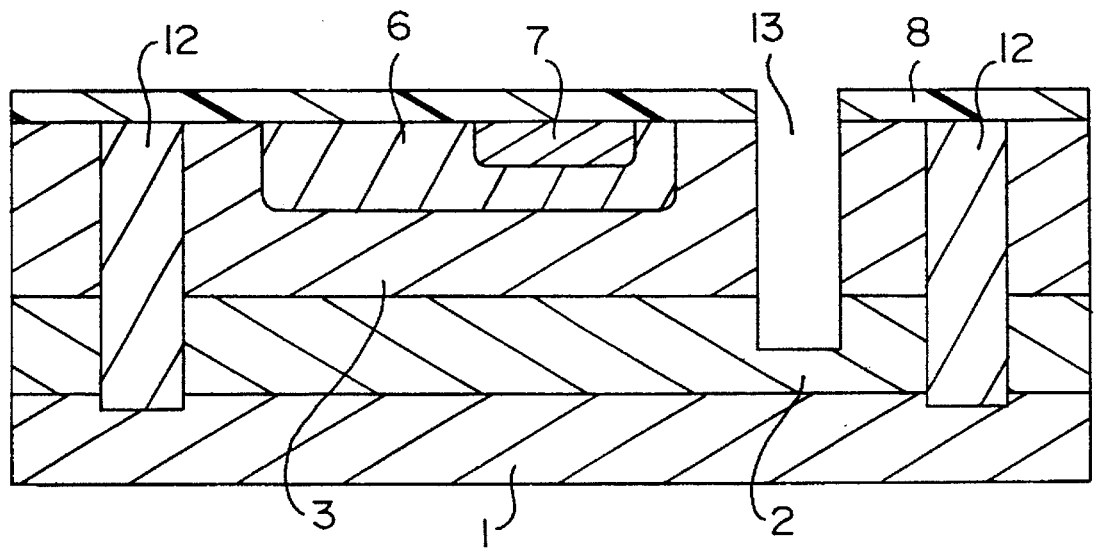
FIGS. 4A to 4C are fragmentary cross sectional elevation views illustrative of sequential steps involved in the production of a novel bipolar transistor exhibiting a low collector series resistance of a first embodiment according to the present invention.
Figure 4B:
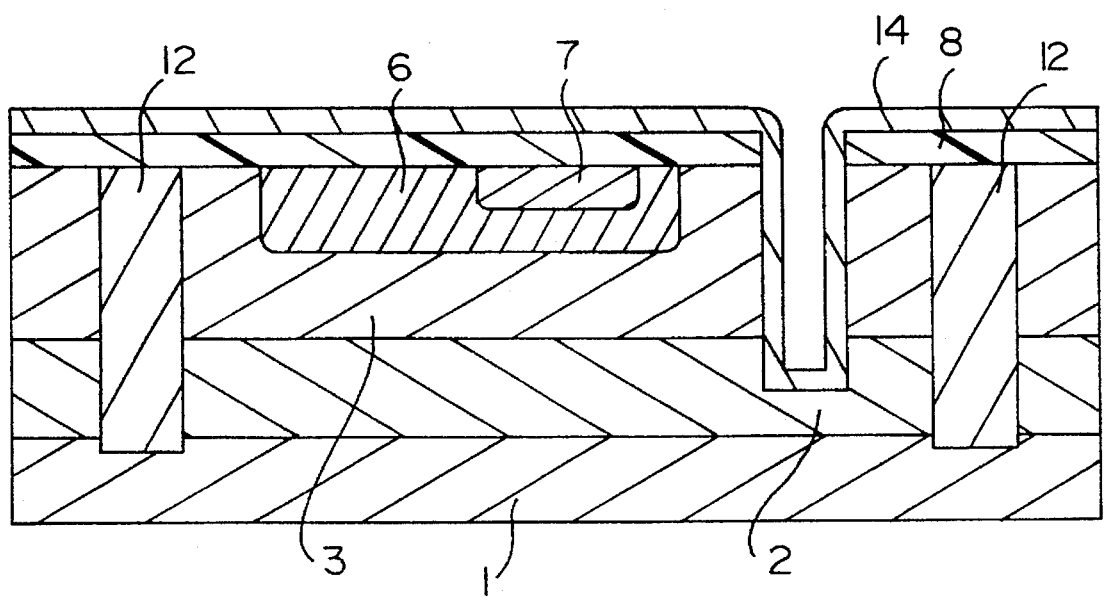
Figure 4C:
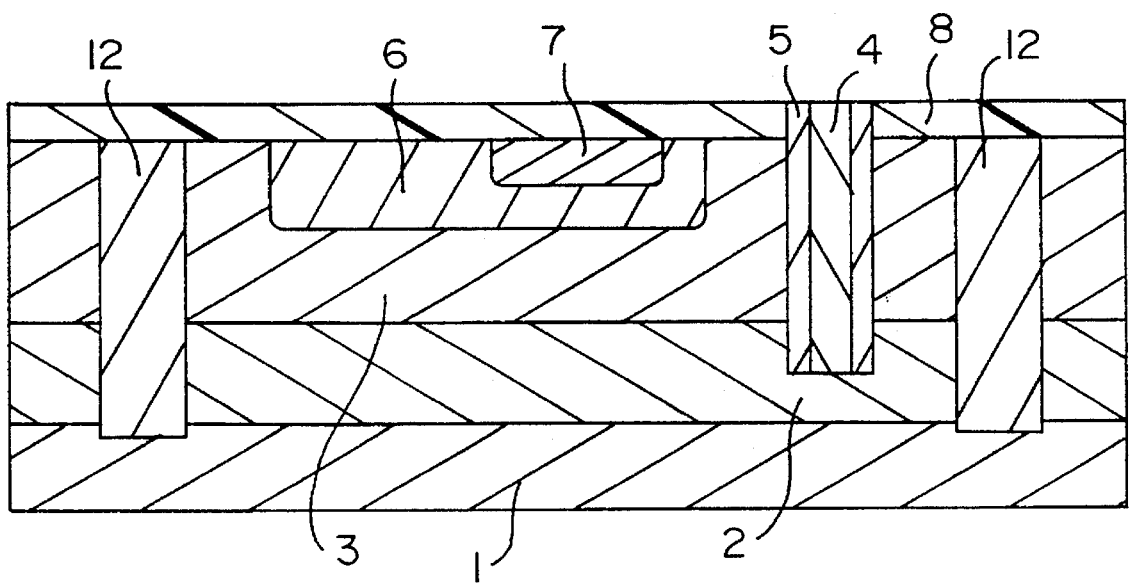

In addition, as shown in FIG. 4A, a trench groove 13 is formed by anisotropic etching in the n-type silicon epitaxial layer 3 and the n⁺-type low resistive buried layer 2 so that a bottom of the trench groove 13 does not reach the p-type silicon substrate 1 and thus exists within the n⁺-type low resistive buried layer 2. As shown in FIG. 4B, an amorphous silicon film 14 is formed on an entire surface of the device. Then, the amorphous silicon film 14 covers a surface of the trench groove 13 and the surface of the insulation film 8. After that, anisotropic etching of the amorphous silicon film 14 is so accomplished that the amorphous silicon film 14 is removed but for a portion thereof on the side walls of the trench groove 13. Namely, the amorphous silicon film 14 remains only on the side walls of the trench groove 13. This remaining amorphous silicon film is not doped thereby resulting in a formation of a non-doped amorphous silicon film 5. A metal material multi-layer of tungsten/titanium nitride/titanium is deposited on an entire surface of the device, and thus on the exposed surface of the insulation film 8, the non-doped amorphous silicon film 5 and the bottom of the trench groove 13. As a result, the trench groove 13, the side wall of which is covered with the non-doped amorphous silicon film 5, is filled with the metal material. After that, the deposited metal material is so etched that the metal material remains only within the trench groove 13. As shown in FIG. 4C, a buried metal region 4 is thus formed in the trench groove 13. Thus, the buried metal region 4 is only present at its side surface, and, thus not on its top and bottom surfaces, and contacts one surface of the non-doped amorphous silicon film 5.

Subsequently, vapor deposition of an aluminium based metal suitable as a contact material is so implemented that the contact material layer covers the surface of the device, but contacts the p-type base region 6, the n-type emitter region 7 and surfaces of the non-doped amorphous silicon film 5 and the buried metal region 4 respectively. After that, the aluminium base metal layer is so removed that portions of the aluminium base metal layer remain but only in the vicinity of the above opening portions. Then, these remaining portions of the aluminium base metal layer respectively serve as a base contact 11, an emitter contact 10 and a collector contact 9.

Such novel metal-semiconductor contact structure with the non-doped amorphous silicon film 5 provides the following advantages. The non-doped amorphous silicon film 5 serves to insulate the buried metal region 4 from the n-type silicon epitaxial layer 3 and the n⁺-type low resistive buried layer 2, by having a higher resistance than the region 4 and the layers 3 and 2. Namely, the non-doped amorphous silicon film 5 serves as an insulator. The non-doped amorphous silicon film 5 serving as an insulator is able to suppress a Schotkky contact from being formed at the interface thereof. An electrical current of carriers flows from the buried metal region 4 through its bottom to the n⁺-type low resistive buried layer 2, because the side portion of the buried metal region 4 is covered with the non-doped amorphous silicon film 5. Thus, the non-doped amorphous silicon film 5 is able to keep electrons from moving from the n-type silicon epitaxial layer 3 to the buried metal region 4 through itself. Namely, the non-doped amorphous silicon film 5 is able to prevent the bipolar transistor from short circuiting from the buried metal region 4 and the n-type silicon epitaxial layer 3. Further, the existence of the non-doped amorphous silicon film 5 between the buried metal region 4 and the n-type silicon epitaxial layer 3 permits reducing the distance between the buried metal region 4 serving as a collector plug and the p-type base region 6 up to 80% as compared to the prior art. Thus, the non-doped amorphous silicon film 5 allows a miniatunization of the bipolar transistor and makes possible high density integration of integrated circuits.

Needless to say, such metal-semiconductor contact structure with the non-doped amorphous silicon film 5 enables the bipolar transistor to possess a low collector series resistance. The buried metal region 4 has a low resistivity as it is made of a highly conductive metal multi-layer of tungsten/titanium nitride/titanium. The low resistivity possessed by the existence of the buried metal region 4 reduces the collector series resistance. The reduction of the collector series resistance provided by the buried metal region 4 permits the bipolar transistor to exhibit high speed performance.

Accordingly, such novel metal-semiconductor contact structure represented by the contact of the buried metal region 4 with the n-type silicon epitaxial layer 3 with the non-doped amorphous silicon film 5 serving as an insulator permits not only the bipolar transistor to exhibit high speed performance but also an improvement in the minitunization of the bipolar transistor.

Additionally, the above non-doped amorphous silicon film 5 is replaceable with a non-doped polycrystalline silicon film, because polycrystalline silicon has a wider band gap than band gap of mono-crystalline silicon. Thus, the non-doped polycrystalline silicon film is able to serve as an insulator between the buried metal region 4 and the n-type epitaxial silicon layer 3. Then, the non-doped polycrystalline silicon film is also able to prevent the bipolar transistor from short circuiting the buried metal region 4 and the n-type silicon epitaxial layer 3.

Further, the metal multi-layer structure of tungsten/titanium nitride/titanium used for the buried metal region 4 is also replaceable with other highly conductive metal multi-layers of molybdenum and copper.

Furthermore, such metal-semiconductor contact structure with the non-doped amorphous silicon film 5 is applicable not only to the collector plug but also to other contacts in the bipolar transistor.

Still further, such metal-semiconductor contact structure with the non-doped amorphous silicon film 5 is applicable to a collector plug or other contacts involved in p-n-p bipolar transistors.

Still further, such metal-semicondutor contact structure with the non-doped amorphous silicon film 5 is applicable to contacts in other semiconductor devices except for the bipolar transistor.

Figure 5:
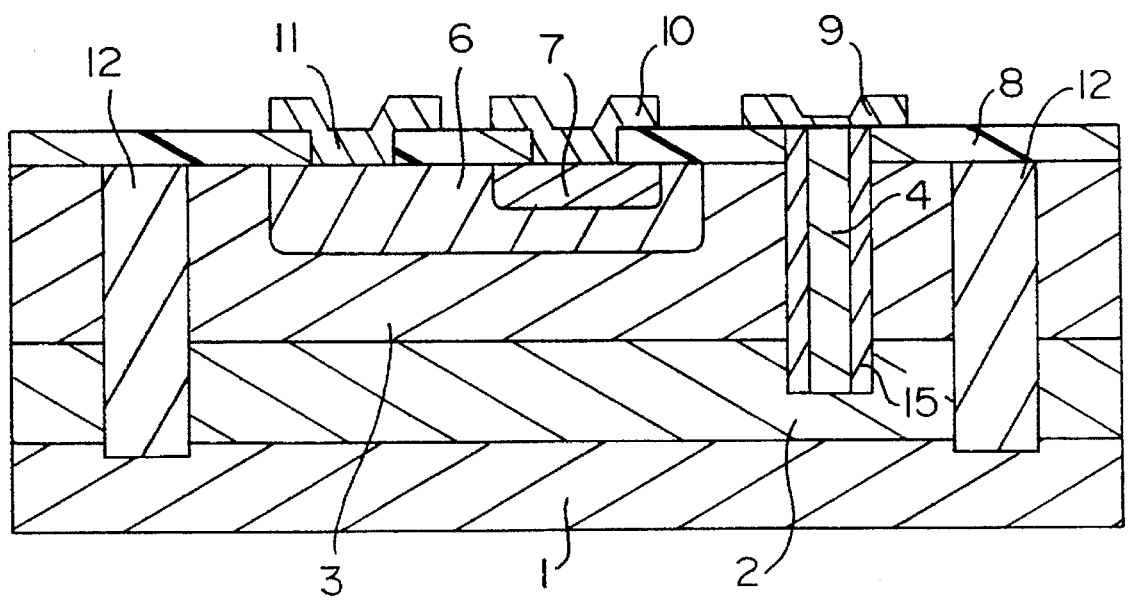
FIG. 5 is a fragmentary cross sectional elevation view illustrative of a structure of a novel bipolar transistor exhibiting a low collector series resistance of a second embodiment according to the present invention.

A second embodiment of the present invention will be described in detail with reference to FIG. 5. The second embodiment of the present invention is a novel bipolar transistor, although it is applicable to a semiconductor devices. A novel bipolar transistor of the second embodiment includes an improved metal semiconductor contact structure in which a metal region serves as a collector plug.

A structure of a novel bipolar transistor according to the second embodiment of the present invention will be described with reference to FIG. 5. The structure of a novel bipolar transistor according to the second embodiment is analogous to that of the first embodiment, but for the non-doped amorphous silicon film 5 in the first embodiment. The novel silicon bipolar transistor has a p-type silicon substrate 1. An $n^+$-type low resistive buried layer 2 overlies the silicon substrate 1. An n-type silicon epitaxial layer 3 overlies the $n^+$-type low resistive buried layer 2. Trench isolation regions 12 exist in the n-type silicon epitaxial layer 3 and the $n^+$-type low resistive buried layer 2. A bottom of each of the trench isolation regions 12 reaches the p-type silicon substrate 1 so as to electrically separate a bipolar transistor from other elements.

Further, an insulation film 8 covers the n-type silicon epitaxial layer 3 in which openings are formed in the insulation film 8. A p-type base region 6 exists at an upper portion of the n-type silicon epitaxial layer 3. An n-type emitter region 7 exists at an upper portion of the p-type base region 6. A base contact 11 exists on the p-type base region 6. An emitter contact 10 exists on the n-type emitter region 7. A collector contact 9 exists on a collector portion.

In addition, a buried metal region 4 made of a metal multi-layer of tungsten/titanium nitride/titanium exists directly under the collector contact 9 so as to be in contact with the collector contact 9. A surface of the side of the buried metal region 4 is covered with an n-type doped amorphous silicon film 15. The n-type doped amorphous silicon film 15 is heavily doped with an n-type dopant such as phosphorus and arsenic so as to have a dopant concentration of approximately $5\times10^{18}$ atoms/cm$^3$. Thus, the buried metal region 4 is present only at its side surface, and thus not on its top and bottom surfaces and, contacts one surface of the n-type doped amorphous silicon film 15. The n-type doped amorphous silicon film 15 at its opposite surface abuts the n-type silicon epitaxial layer 3 and the $n^{30}$-type low resistive buried layer 2. Although in this second embodiment the n-type doped amorphous silicon film 15 covers the entire surface of the side of the buried metal region 4, it is necessary that the n-type doped amorphous silicon film 15 covers the buried metal region 4 at least at its area of side surface which contacts the n-type silicon epitaxial layer 3.

Such novel metal-semiconductor contact structure with the n-type doped amorphous silicon film 15 has the following advantages. The dopant concentration $5\times10^{18}$ of the n-type doped amorphous silicon film 15 is so high as to form an ohmic barrier at the interface between the n-type doped amorphous silicon film 15 and the buried metal region 4. As compared to the Schottky barrier contact between metal and semiconductor, the ohmic barrier contact between metal and semiconductor makes the inherent potential barrier in the vicinity of the interface within the n-type doped amorphous silicon film 15 much higher. The existence of a high inherent potential barrier in the vicinity of the interface within the n-type doped amorphous silicon film 15 makes it difficult for electrons as majority carriers to overcome the ohmic barrier and move from the n-type doped amorphous silicon film 15 to the buried metal region 4.

In addition, amorphous silicon generally has a wider band gap than a band gap of a mono-crystalline silicon. The wider band gap possessed by amorphous silicon prevents a space charge region formed at the interface between the n-type doped amorphous silicon film 15 and the buried metal region 4 from becoming so thin that electrons can tunnel through the ohmic barrier.

Thus, an electrical current of carriers flows from the buried metal region 4 through its bottom to the $n^+$-type low resistive buried layer 2, because the side portion of the buried metal region 4 is covered with the n-type doped amorphous silicon film 15. The n-type doped amorphous silicon film 15 is able to keep electrons from moving from the n-type silicon epitaxial layer 3 to the buried metal region 4 through itself. Namely, the n-type doped amorphous silicon film 15 is able to prevent the bipolar transistor from short circuiting the buried metal region 4 and the n-type silicon epitaxial layer 3. Further, the existence of the n-type doped amorphous silicon film 15 between the buried metal region 4 and the n-type silicon epitaxial layer 3 permits reducing the distance between the buried metal region 4 serving as a collector plug and the p-type base region 6 by 10% as compared to the bipolar transistor of the first embodiment. Then, the n-type doped amorphous silicon film 5 allows a miniatunization of the bipolar transistor and achieves a high density integration of integrated circuits.

Needless to say, such metal-semiconductor contact structure with the n-type doped amorphous silicon film 15 enables the bipolar transistor to possess a low collector series resistance. The buried metal region 4 has a low resistivity because it is made of a highly conductive metal multi-layer of tungsten/titanium nitride/titanium. The low resistivity possessed by the existence of the buried metal region 4 reduces the collector series resistance. The reduction of the collector series resistance provided by the buried metal region 4 permits the bipolar transistor to exhibit high speed performance.

Accordingly, such novel metal-semiconductor contact structure represented by the contact of the buried metal region 4 with the n-type silicon epitaxial layer 3 through the n-type doped amorphous silicon film 15 serving as an insulator allows not only the bipolar transistor to exhibit high speed performance but also allow miniaturization of the bipolar transistor to be improved.

Additionally, the above n-type doped amorphous silicon film 15 is replaceable with an n-type doped polycrystalline silicon film, because polycrystalline silicon has a wider band gap than a band gap of mono-crystalline silicon. In addition, the n-type doped polycrystalline silicon film forms an ohmic barrier between the buried metal region 4 and the n-type epitaxial silicon layer 3. Further, the n-type doped polycrystalline silicon film prevents electrons as majority carriers from overcoming the ohmic barrier and from tunneling from the n-type doped polycrystalline silicon film to the buried metal region 4. Then, the n-type doped polycrystalline silicon film is also able to prevent the bipolar transistor from short circuiting the buried metal region 4 and the n-type silicon epitaxial layer 3.

Further, the metal multi-layer of tungsten/titanium nitride/titanium used for the buried metal region 4 is also repraceable with other highly conductive metals such as molybdenum and copper.

Furthermore, such metal-semiconductor contact structure with the n-type doped amorphous silicon film 15 is applicable not only to the collector plug but also to the other contacts of bipolar transistors.

Still further, such metal-semiconductor contact structure with the n-type doped amorphous silicon film 15 is applicable to a collector plug or other contacts of p-n-p bipolar transistors.

Still further, such metal-semiconductor contact structure with the n-type doped amorphous silicon film 15 is applicable to a contacts of other semiconductor devices except for the bipolar transistor.

Whereas modifications of the present invention will no doubt be apparent to a person of ordinary skill in the art, it is to be understood that the embodiments shown and described are not to be construed in a limiting sense. Accordingly, it is intended by the claims to cover all modifications of the invention which fall within the spirit and scope of the invention.

What is claimed is:

1. A semiconductor device having a metal semiconductor contact structure comprising:

a semiconductor substrate of one conductive type;

a first semiconductor region of opposite conductive type formed on said substrate, said first semiconductor region comprising a buried layer formed on said semiconductor substrate and an epitaxial layer formed on said buried layer, said buried layer having a higher dopant concentration than a dopant concentration of said epitaxial layer;

a second semiconductor region of said one conductive type in contact with said first semiconductor region;

a third semiconductor region of said opposite conductive type in contact with said second semiconductor region;

a metal region formed in said first semiconductor region, said metal region being of sufficient conductivity to serve as a contact plug, said metal region comprising a bottom surface within said buried layer;

a semiconductor film having a wider band gap than a band gap of said first semiconductor region, said semiconductor film being in contact at its opposite surfaces with a part of said metal region and a part of said first semiconductor region, said semiconductor film being sufficiently doped with dopant of said one conductive type to suppress an electrical current flow of carriers between said part of said metal region and said part of said first semiconductor region through said semiconductor film, said semiconductor film covering opposite side portions of said metal layer without lowering a top and bottom surface of said metal layer.

2. A semiconductor device having a metal semiconductor contact structure comprising:

a semiconductor substrate of one conductive type;

a first semiconductor region of monocrystalline silicon of opposite conductive type formed on said substrate;

a second semiconductor region of said one conductive type in contact with said first semiconductor region;

a third semiconductor region of said opposite conductive type in contact with said second semiconductor region;

a metal region formed in said first semiconductor region, said metal region being of sufficient conductivity to serve as a contact plug;

a semiconductor film formed of amorphous silicon having a wider band gap than a band gap of said first semiconductor region, said semiconductor film being in contact at its opposite surfaces with a part of said metal region and a part of said first semiconductor region, said semiconductor film being sufficiently doped with dopant of said one conductive type to suppress an electrical current flow of carriers between said part of said metal region and said part of said first semiconductor region, through said semiconductor film.

* * * * *